(12) United States Patent
Prushinskiy et al.

(10) Patent No.: US 9,006,012 B2
(45) Date of Patent: Apr. 14, 2015

(54) ORGANIC LIGHT EMITTING DIODE DISPLAY AND METHOD OF MANUFACTURING THE SAME

(71) Applicant: Samsung Display Co., Ltd., Yongin, Gyeonggi-Do (KR)

(72) Inventors: Valeriy Prushinskiy, Yongin (KR); Min-Soo Kim, Yongin (KR); Won-Sik Hyun, Yongin (KR); Heung-Yeol Na, Yongin (KR); Jin-Won Sun, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/057,326

(22) Filed: Oct. 18, 2013

(65) Prior Publication Data

US 2014/0291632 A1    Oct. 2, 2014

(30) Foreign Application Priority Data

Mar. 27, 2013    (KR) .......................... 10-2013-0033064

(51) Int. Cl.
*H01L 29/08*    (2006.01)
*H01L 51/56*    (2006.01)
*H01L 51/52*    (2006.01)

(52) U.S. Cl.
CPC ............ *H01L 51/56* (2013.01); *H01L 51/5203* (2013.01)

(58) Field of Classification Search
CPC .................... H01L 27/14603; H01L 27/14609

USPC ............................... 257/E27.131, 40; 438/42
See application file for complete search history.

(56) References Cited

U.S. PATENT DOCUMENTS

| 8,334,168 | B2 | 12/2012 | Cho et al. | |
|---|---|---|---|---|
| 8,389,984 | B2 | 3/2013 | Park et al. | |
| 8,415,675 | B2 | 4/2013 | Im et al. | |
| 8,415,688 | B2 | 4/2013 | Song et al. | |
| 2007/0046880 | A1* | 3/2007 | Shigeta et al. | 349/138 |
| 2010/0276680 | A1 | 11/2010 | Kang et al. | |
| 2013/0009162 | A1 | 1/2013 | Kang | |
| 2013/0020018 | A1 | 1/2013 | Song et al. | |

FOREIGN PATENT DOCUMENTS

| KR | 10-2006-0055061 A | 5/2006 |
|---|---|---|
| KR | 10-2006-0080302 A | 7/2006 |
| KR | 10-2007-0035857 A | 4/2007 |
| KR | 10-2007-0096082 A | 10/2007 |

* cited by examiner

*Primary Examiner* — Fernando L Toledo
*Assistant Examiner* — Neil Prasad
(74) *Attorney, Agent, or Firm* — Robert E. Bushnell, Esq.

(57) ABSTRACT

A method of manufacturing an organic light emitting diode display according to an exemplary embodiment of the present invention includes: forming a first electrode on a substrate; forming an insulation layer on the first electrode; etching the insulation layer to expose the first electrode so as to form a pixel defining layer having the same height as the first electrode; forming an organic layer including one or more emission layers on the first electrode of a sub-pixel region defined by the pixel defining layer by applying a laser-induced thermal imaging (LITI) method; and forming a second electrode on the organic layer.

10 Claims, 14 Drawing Sheets

ORGANIC LIGHT EMITTING DIODE DISPLAY AND METHOD OF MANUFACTURING THE SAME

CLAIM OF PRIORITY

This application claims priority to and the benefit of Korean Patent Application No. 10-2013-0033064 filed in the Korean Intellectual Property Office on Mar. 27, 2013, the entire contents of which are incorporated herein by reference.

BACKGROUND OF THE INVENTION

1. Field of the Invention

The present invention relates to an organic light emitting diode (OLED) display and a method of manufacturing the same, and more particularly, to an organic light emitting diode display and a method of manufacturing the same, which include an organic layer imaging process by a laser-induced thermal imaging (LITI) method.

2. Description of the Related Art

A full-color organic light emitting diode display includes a first electrode pattern formed on a substrate. In a lower light emitting type organic light emitting diode display, the first electrode is a transparent electrode. In an upper light emitting type organic light emitting diode display, the first electrode is formed of a transparent conductive material and includes a reflection layer.

A pixel defining layer (PDL) is made of an insulation material formed on the first electrode and insulates a pixel region and an organic layer from each other to separate the pixel region and the organic layer. In the pixel region defined by the pixel defining layer, an organic layer including organic emission layers (R, G, B) is formed. Furthermore, the organic layer may include a hole injection layer (HIL), a hole transfer layer (HTL), a hole blocking layer (HBL), an electron transfer layer (ETL), an electron injection layer (EIL), and the like. The organic emission layer may be formed of a polymer or a fine molecule material.

A second electrode is formed on the organic layer. If the first electrode is the transparent electrode, the second electrode is formed of a conductive metal layer used as the reflection electrode, and if the first electrode is the transparent electrode including the reflection layer, the second electrode is formed of the transparent electrode. In addition, the organic light emitting diode display is sealed and accomplished.

In order to form the organic emission layer, a donor film used in a laser-induced thermal imaging (LITI) method includes a base film, a light-to-heat conversion layer, and an imaging layer.

If the light-to-heat conversion layer is expanded by applying laser energy thereto, the imaging layer is expanded so as to be separated from the donor film, thus being imaged on the first electrode of the organic light emitting diode display.

However, in the laser-induced thermal imaging process, when the donor film is laminated on the organic light emitting diode display, there is concern that micropores may be formed in an imaging material of the pixel region which reduces performance of a display device and significantly reduces a life-span.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide an organic light emitting diode display structure and a method of manufacturing the same, in which gas generated during an organic layer imaging process by a laser-induced thermal imaging (LITI) method can be exhausted, and thus pores can be prevented from being generated in a pixel region on which an organic layer is imaged and an imaging film can be stably disposed.

An exemplary embodiment of the present invention provides a method of manufacturing an organic light emitting diode display, including: forming a first electrode on a substrate; forming an insulation layer on the first electrode; etching the insulation layer to expose the first electrode so as to form a pixel defining layer having the same height as the first electrode; forming an organic layer including one or more emission layers on the first electrode of a sub-pixel region defined by the pixel defining layer by applying a laser-induced thermal imaging (LITI) method; and forming a second electrode on the organic layer.

The pixel defining layer may have the same height as the first electrode in the sub-pixel region, and may be formed so as to gradually become tall in a region between the sub-pixel regions.

The pixel defining layer may be formed only around the first electrode, and may not be formed in a region between the sub-pixel regions.

The pixel defining layer may be formed only around the first electrode and in a region between the sub-pixel regions, and may have the same height as the first electrode in a region around the first electrode and may be lower than the first electrode in the region between the sub-pixel regions.

The pixel defining layer may have grooves formed around the first electrode and in a region between the sub-pixel regions, and the pixel defining layer may be formed so as to have the same height as the first electrode in a region around the first electrode and be higher than the first electrode in the region between the sub-pixel regions.

The pixel defining layer may have the same height as the first electrode in a region around the first electrode and may have a plurality of grooves having the same height as the first electrode for preventing attachment of an imaging layer in a region between the sub-pixel regions.

The pixel defining layer may have the same height as the first electrode and may have a plurality of grooves havingae height that is smaller than the height of the first electrode for preventing attachment of an imaging layer in a region between the sub-pixel regions.

Another exemplary embodiment of the present invention provides an organic light emitting diode display including: first electrodes formed on a substrate; a pixel defining layer formed between the first electrodes on the substrate, having the same height as the first electrodes, and defining a sub-pixel region; an organic layer disposed on the first electrodes and including one or more emission layers; and a second electrode formed on the organic layer.

The second electrode may be formed of a transparent or semi-transparent electrode including any one material of calcium (Ca), magnesium (Mg), a magnesium-silver (MgAg) alloy, silver (Ag), a silver alloy, aluminum (Al), and an aluminum alloy.

Yet another exemplary embodiment of the present invention provides a method of manufacturing an organic light emitting diode display, including: forming a first electrode on a substrate; forming an organic layer including one or more emission layers on the first electrode by applying a laser-induced thermal imaging method without forming a pixel defining layer on the substrate; and forming a second electrode on the organic layer.

According to the exemplary embodiments of the present invention, it is possible to exhaust gas generated in a pixel region during an imaging process by laser-induced thermal imaging during a process of manufacturing an organic light emitting diode display, to prevent pores from being generated, and to stably dispose a donor film on a substrate to improve imaging quality.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
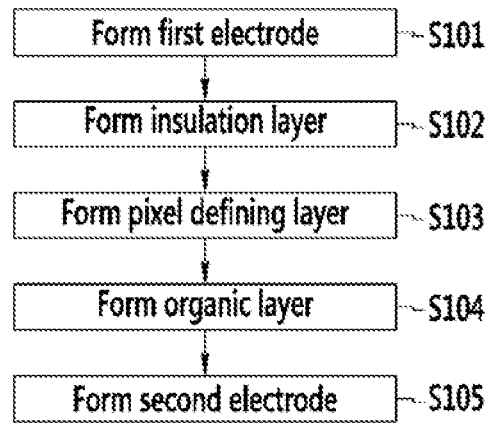
FIG. 1 is a flowchart illustrating a method of manufacturing an organic light emitting diode display according to a first exemplary embodiment of the present invention.

Hereinafter, exemplary embodiments of the present invention will be described more fully with reference to the accompanying drawings, in which exemplary embodiments of the invention are shown. As those skilled in the art will realize, the described embodiments may be modified in various different ways, all without departing from the spirit or scope of the present invention.

In addition, in various exemplary embodiments, the same reference numerals are used with respect to the constituent elements having the same constitution, and the constituent elements are representatively described in the first exemplary embodiment, and in the other exemplary embodiments, only constitution that is different from the first exemplary embodiment is described.

It is noted that the drawings are schematic and are not dimensionally illustrated. Relative dimensions and ratios of portions of the drawings are exaggerated or reduced in size for clarity and convenience in the drawings, and a predetermined dimension is only illustrative but not limiting. In addition, the same reference numerals designate the same structures, elements, or parts illustrated in two or more drawings in order to exhibit similar characteristics. It will be understood that, when an element is referred to as being "on" or "over" another element, it can be directly on the other element or intervening elements may also be present.

An exemplary embodiment of the present invention specifically illustrates one exemplary embodiment of the present invention. As a result, various modifications of the drawings are expected. Accordingly, the exemplary embodiment is not limited to a specific form of the illustrated region, and for example, includes a modification of a form by manufacturing.

Hereinafter, a method of manufacturing an organic light emitting diode display according to a first exemplary embodiment of the present invention will be described with reference to FIGS. 1, and 2A to 2D.

Figure 2A:
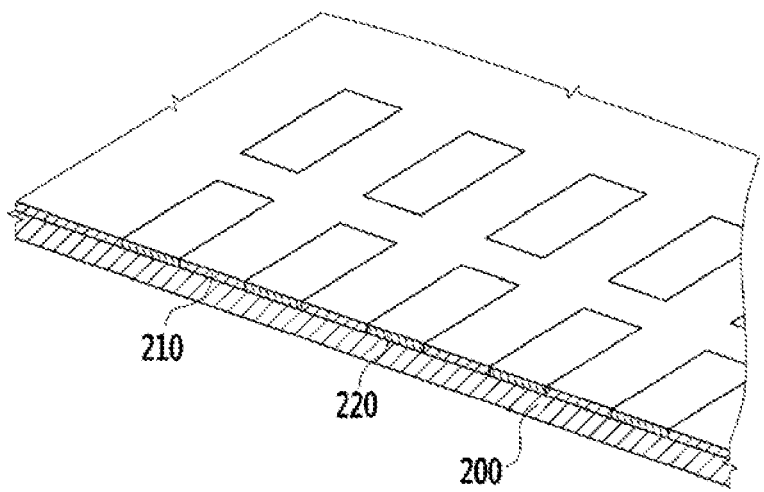
FIG. 2A is a perspective view schematically illustrating a state where a pixel defining layer and a first electrode are formed on a substrate of the organic light emitting diode display according to the first exemplary embodiment of the present invention.
Figure 2B:
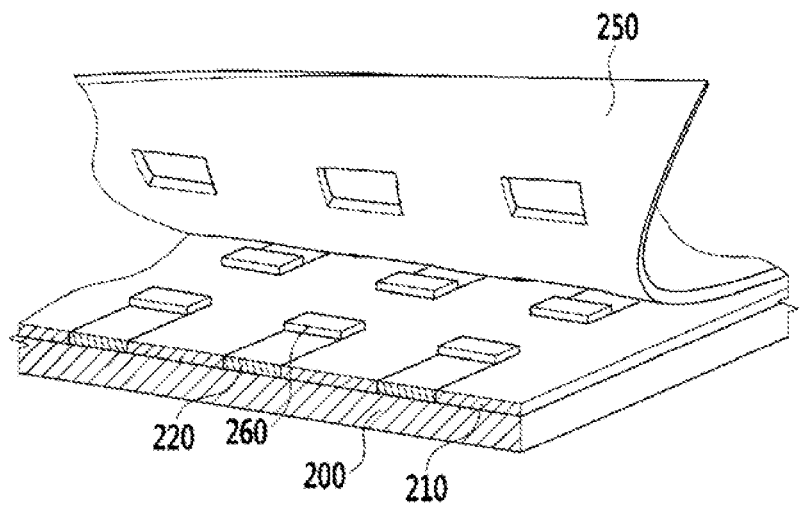
FIG. 2B is a perspective view schematically illustrating a figure where an organic layer is imaged in the organic light emitting diode display according to the first exemplary embodiment of the present invention.
Figure 2C:
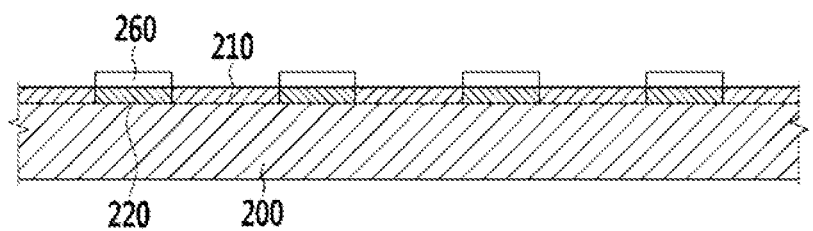
FIG. 2C is a cross-sectional view schematically illustrating the figure where the organic layer is imaged in the organic light emitting diode display according to the first exemplary embodiment of the present invention.
Figure 2D:
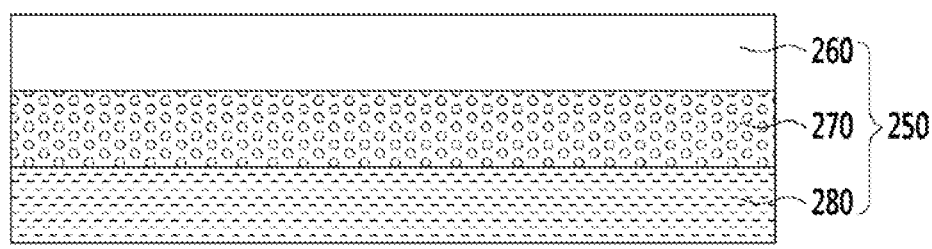
FIG. 2D is a cross-sectional view of a donor film structure used in a laser-induced thermal imaging method according to the first exemplary embodiment of the present invention.

FIG. 1 is a flowchart illustrating the method of manufacturing the organic light emitting diode display according to the first exemplary embodiment of the present invention, FIG. 2A is a perspective view schematically illustrating a state where a pixel defining layer and a first electrode are formed on a substrate of the organic light emitting diode display according to the first exemplary embodiment of the present invention, FIG. 2B is a perspective view schematically illustrating a figure where an organic layer is imaged in the organic light emitting diode display according to the first exemplary embodiment of the present invention, FIG. 2C is a cross-sectional view schematically illustrating the figure where the organic layer is imaged in the organic light emitting diode display according to the first exemplary embodiment of the present invention, and FIG. 2D is a cross-sectional view of a donor film structure used in a laser-induced thermal imaging method according to the first exemplary embodiment of the present invention.

Referring to FIGS. 1 and 2A to 2D, a first electrode 220 is formed on a substrate 200 (S101). The substrate may be formed of glass, quartz, plastic, or metal. The first electrode 220 may have a double or triple laminate structure. The laminate structure of the first electrode 220 may include an upper pixel electrode or upper/lower pixel electrodes formed of a reflection layer and a transparent electrode including any one material selected from the group consisting of ITO, IZO and In. In a lower light emitting structure, the first electrode 220 may be the transparent electrode.

Thereafter, an insulation layer (not illustrated) is formed on an entire surface of the first electrode 220 (S102). The insulation layer may be formed of an organic or inorganic material. In the case where the insulation layer is formed of the organic material, the organic material may include any one material selected from the group consisting of benzocyclobutene (BCB), an acrylic photoresist, a phenol photoresist, and a polyimide photoresist, but is not limited thereto.

Thereafter, the insulation layer may be etched to form a pixel defining layer 210 (S103). The pixel defining layer 210 may be formed by etching the insulation layer using a wet etching method or a dry etching method. In this case, the insulation layer is etched so as to expose the first electrode 220. The height of the pixel defining layer 210 may be the same as the height of the first electrode 220 for stable disposal of an imaging layer on the electrodes, stable adhesion during an imaging process, and for prevention of formation of voids and cavities in the imaged material. In this case, the statement that the height of the pixel defining layer 210 and the height of the first electrode 220 are "the same as each other" means that both heights are "substantially equivalent to each other", and for example, may mean that a difference between the heights of the pixel defining layer 210 and the first electrode 220 is not more than $1/100$ of the height of the pixel defining layer. Hereinafter, the same meaning will be applied.

Thereafter, the laser-induced thermal imaging (LITI) method is applied to form an organic layer 260 (S104). The organic layer 260, including at least one emission layer, may be formed on the first electrode 220 of a sub-pixel region defined by the formed pixel defining layer 210. A donor film 250 used in the laser-induced thermal imaging method, as illustrated in FIG. 2D, has a laminate structure of a base film 280, a light-heat conversion layer 270, and an imaging layer (organic layer) 260. In the imaging process by the donor film 250, the imaging layer 260 may be imaged on the first electrode 220 of the sub-pixel region by expanding the light-heat conversion layer 270 and expanding the imaging layer 260 to separate the layers from the base film 280 of the donor film 250 when laser energy is applied to the donor film 250.

In the present exemplary embodiment, since the height of the pixel defining layer 210 is the same as the height of the first electrode 220, when the organic layer 260 is formed by the laser-induced thermal imaging method and the donor film 250 is disposed at the uppermost layer of the pixel defining layer 210, the donor film 250 may completely adhere to the surface of the first electrode 220 because the donor film 250 is flat. Since the pixel defining layer 210 is flat and is formed so as to have the same height as the first electrode 220, a ventilation property may be improved and gas may not be collected in the sub-pixel region during the imaging process so as to improve imaging quality.

Thereafter, a second electrode (not illustrated) is formed on the organic layer 260 (S105). If the first electrode 220 is the transparent electrode, the second electrode is formed of a conductive metal layer used as the reflection electrode, and if the first electrode 220 is the transparent electrode including the reflection layer, the second electrode is formed of the transparent electrode. In addition, the organic light emitting diode display is sealed and accomplished. The second electrode may be formed of a transparent or semi-transparent electrode including any one material of calcium (Ca), magnesium (Mg), a magnesium-silver (MgAg) alloy, silver (Ag), a silver alloy, aluminum (Al), and an aluminum alloy.

Figure 3A:
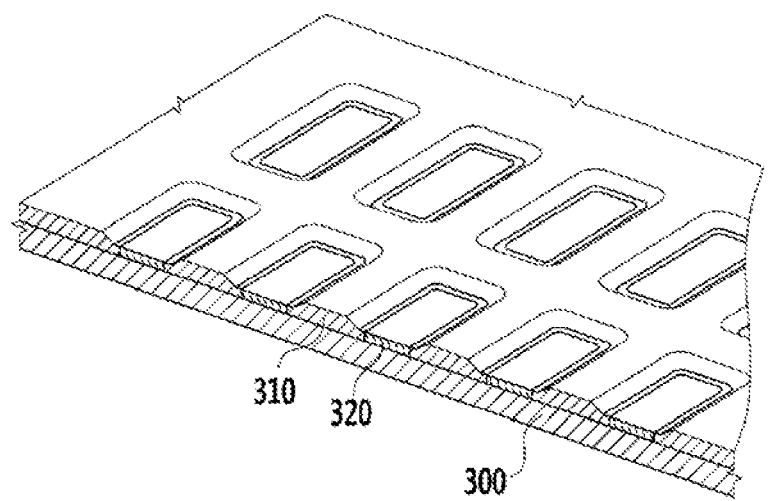
FIG. 3A is a perspective view schematically illustrating a state where a pixel defining layer and a first electrode are formed on a substrate of an organic light emitting diode display according to a second exemplary embodiment of the present invention.
Figure 3B:
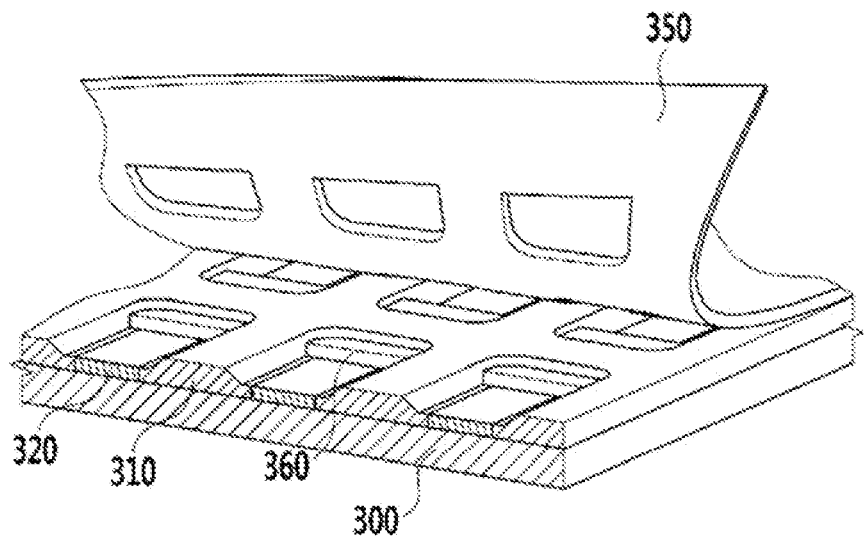
FIG. 3B is a perspective view schematically illustrating a figure where an organic layer is imaged in the organic light emitting diode display according to the second exemplary embodiment of the present invention.
Figure 3C:
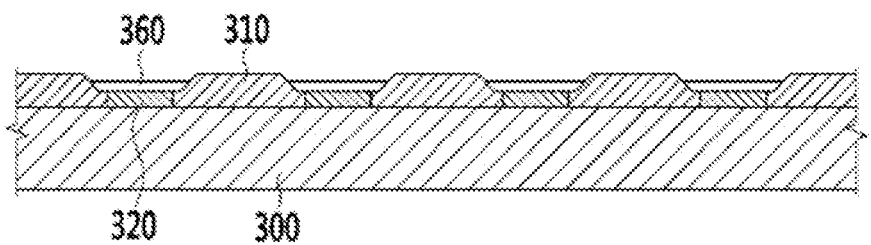
FIG. 3C is a cross-sectional view schematically illustrating the figure where the organic layer is imaged in the organic light emitting diode display according to the second exemplary embodiment of the present invention.

FIG. 3A is a perspective view schematically illustrating a state where a pixel defining layer and a first electrode are formed on a substrate of an organic light emitting diode display according to a second exemplary embodiment of the present invention, FIG. 3B is a perspective view schematically illustrating a figure where an organic layer is imaged in the organic light emitting diode display according to the second exemplary embodiment of the present invention, and FIG. 3C is a cross-sectional view schematically illustrating the figure where the organic layer is imaged in the organic light emitting diode display according to the second exemplary embodiment of the present invention.

Referring to FIGS. 3A to 3C, a process of forming a first electrode 320 on a substrate 300, forming an insulation layer (not illustrated) on an entire surface of the first electrode 320, and thereafter, etching the insulation layer to form a pixel defining layer 310, is the same as the method of manufacturing the organic light emitting diode display according to the first exemplary embodiment. Furthermore, a donor film used when the laser-induced thermal imaging method is applied is the same as that of the method of manufacturing the organic light emitting diode display according to the first exemplary embodiment.

In this case, the pixel defining layer 310 may have the same height as the first electrode 320 in a sub-pixel region. Furthermore, the pixel defining layer 310 may be formed so as to gradually become tall in a region between the sub-pixel regions. The pixel defining layer 310 may be formed to gradually become tall at a predetermined angle from the sub-pixel region to the region between the sub-pixel regions, and then become flat.

Thereafter, the laser-induced thermal imaging method is applied to form an organic layer 360 on the first electrode 320. An imaging layer 360 of the donor film is expanded by applying laser energy so as to be separated from a base film of the donor film to be imaged on flat portions of the first electrode 320 of the sub-pixel region and the pixel defining layer 310 in the sub-pixel region and an inclined portion of the pixel defining layer 310, thus being laminated. In the present exemplary embodiment, since the imaging layer 360 is laminated so as to have a height that is lower than the height of the pixel defining layer 310 in the region between the sub-pixel regions, in an imaging process, a ventilation property may be improved and gas may not be collected in the sub-pixel region so as to improve imaging quality in the imaging process. Furthermore, this form of the pixel defining layer 310 prevents expansion of the imaging layer 360 during the imaging process.

Thereafter, a second electrode (not illustrated) is formed on the organic layer 360 so as to seal the organic light emitting diode display, thus accomplishing the organic light emitting diode display.

Figure 4A:
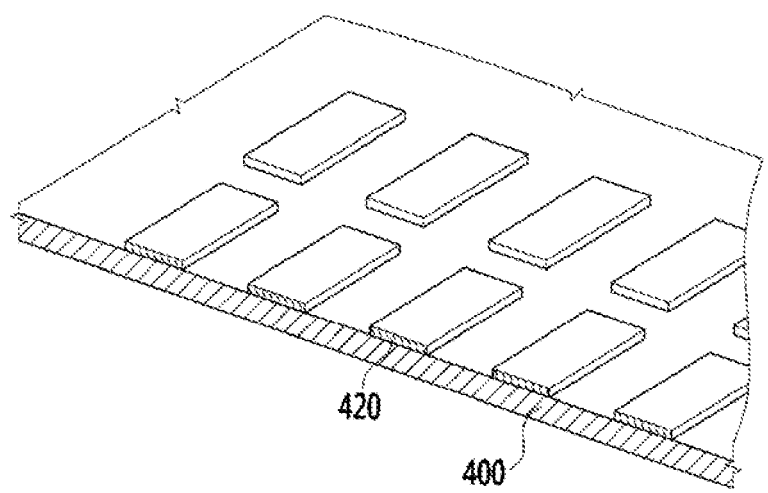
FIG. 4A is a perspective view schematically illustrating a state where a first electrode is formed on a substrate of an organic light emitting diode display according to a third exemplary embodiment of the present invention.
Figure 4B:
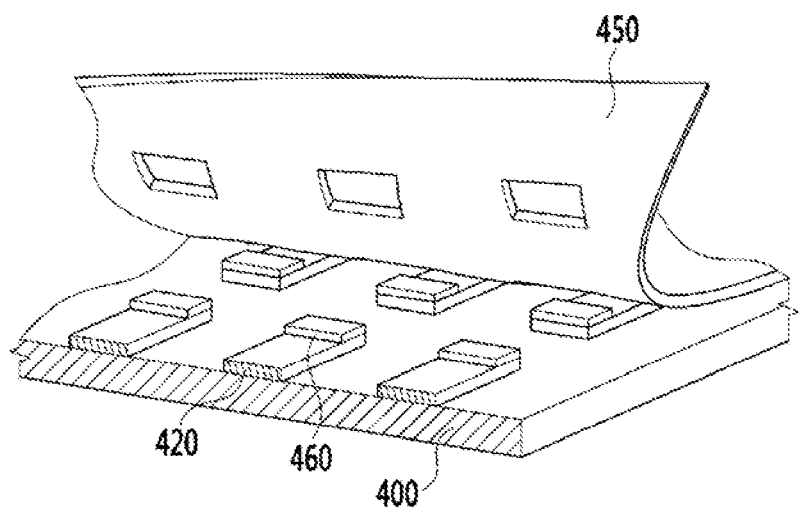
FIG. 4B is a perspective view schematically illustrating a figure where an organic layer is imaged in the organic light emitting diode display according to the third exemplary embodiment of the present invention.
Figure 4C:
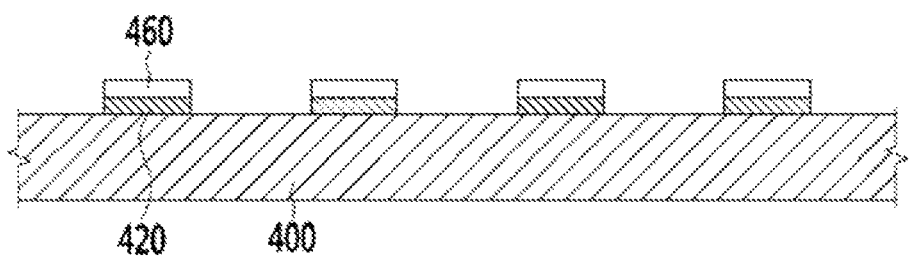
FIG. 4C is a cross-sectional view schematically illustrating the figure where the organic layer is imaged in the organic light emitting diode display according to the third exemplary embodiment of the present invention.

FIG. 4A is a perspective view schematically illustrating a state where a first electrode is formed on a substrate of an organic light emitting diode display according to a third exemplary embodiment of the present invention, FIG. 4B is a perspective view schematically illustrating a figure where an organic layer is imaged in the organic light emitting diode display according to the third exemplary embodiment of the present invention, and FIG. 4C is a cross-sectional view schematically illustrating the figure where the organic layer is imaged in the organic light emitting diode display according to the third exemplary embodiment of the present invention.

Referring to FIGS. 4A to 4C, after a first electrode 420 is formed on a substrate 400, a very thin insulation layer (not illustrated) is formed on the first electrode 420 and the substrate 400. Since the insulation layer is very thin, a pixel defining layer is not formed. Since an imaging layer 460 is not bent, the imaging layer 460 on the first electrode 420 is further stably disposed and an attachment property is improved during an imaging process.

Thereafter, a laser-induced thermal imaging method is applied so as to form an organic layer 460 on the first electrode 420. Since the pixel defining layer does not exist, in the imaging process, a ventilation property is improved and gas is not collected in the sub-pixel region so as to improve imaging quality. However, since the pixel defining layer does not exist, expansion of the imaging layer 460 is not prevented during the imaging process.

Thereafter, a second electrode (not illustrated) is formed on the organic layer 460 so as to seal the organic light emitting diode display, thus accomplishing the organic light emitting diode display.

Figure 5A:
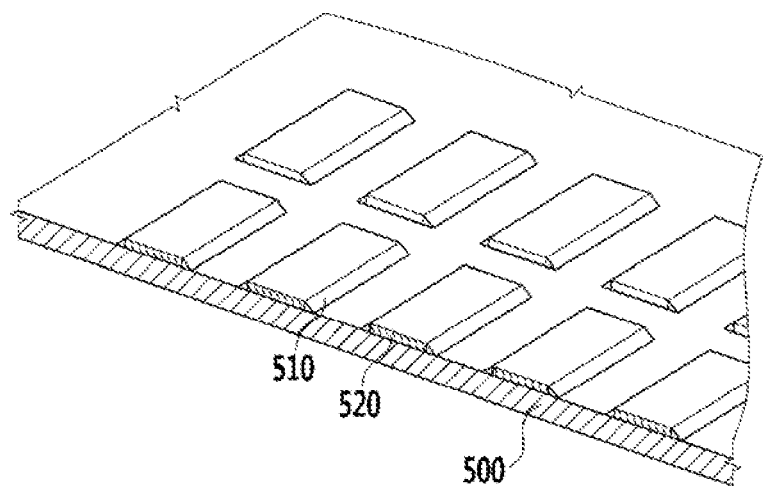
FIG. 5A is a perspective view schematically illustrating a state where a pixel defining layer and a first electrode are formed on a substrate of an organic light emitting diode display according to a fourth exemplary embodiment of the present invention.
Figure 5B:
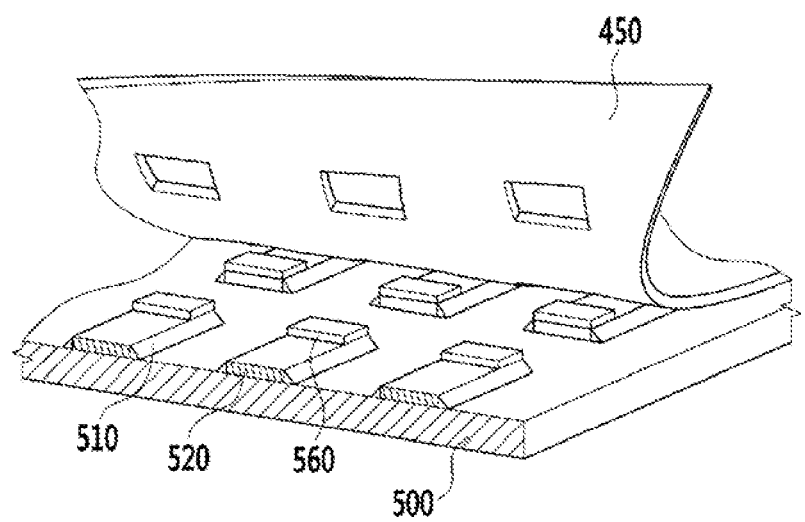
FIG. 5B is a perspective view schematically illustrating a figure where an organic layer is imaged in the organic light emitting diode display according to the fourth exemplary embodiment of the present invention.
Figure 5C:
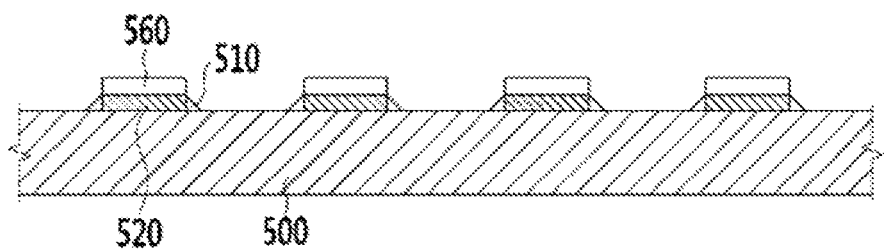
FIG. 5C is a cross-sectional view schematically illustrating the figure where the organic layer is imaged in the organic light emitting diode display according to the fourth exemplary embodiment of the present invention.

FIG. 5A is a perspective view schematically illustrating a state where a pixel defining layer and a first electrode are formed on a substrate of an organic light emitting diode display according to a fourth exemplary embodiment of the present invention, FIG. 5B is a perspective view schematically illustrating a figure where an organic layer is imaged in the organic light emitting diode display according to the fourth exemplary embodiment of the present invention, and FIG. 5C is a cross-sectional view schematically illustrating the figure where the organic layer is imaged in the organic light emitting diode display according to the fourth exemplary embodiment of the present invention.

Referring to FIGS. 5A to 5C, after a first electrode 520 is formed on a substrate 500, a very thin insulation layer (not illustrated) is formed on the first electrode 520 and the substrate 500. The insulation layer may be etched to form a pixel defining layer 510 only around the first electrode 520. Since an imaging layer 560 is not bent, the imaging layer 560 on the first electrode 520 is further stably disposed and an attachment property is improved during an imaging process.

Thereafter, a laser-induced thermal imaging method is applied to form an organic layer 560 on the first electrode 520. Since the pixel defining layer 510 is formed only around the first electrode 520 and does not exist in the other region between sub-pixel regions, in the imaging process, a ventilation property is improved and gas is not collected in the sub-pixel region so as to improve imaging quality. However, since the pixel defining layer 510 is not higher than the first electrode 520, expansion of the imaging layer 560 is not prevented during the imaging process.

Thereafter, a second electrode (not illustrated) is formed on the organic layer 560 to seal the organic light emitting diode display, thus accomplishing the organic light emitting diode display.

Figure 6A:
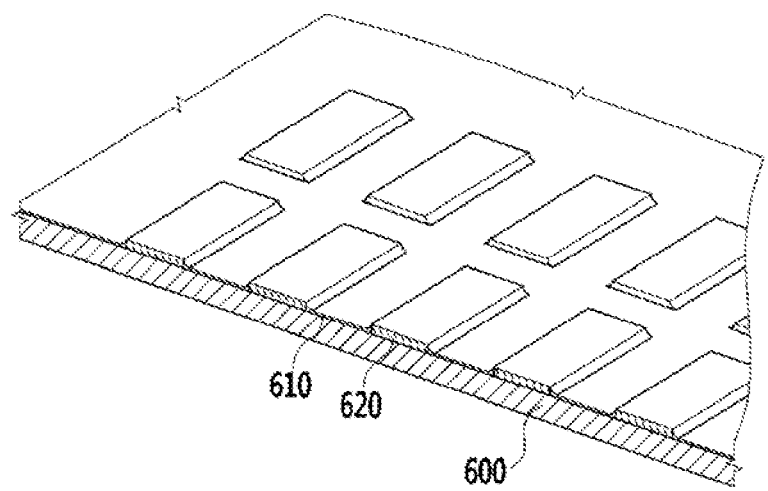
FIG. 6A is a perspective view schematically illustrating a state where a pixel defining layer and a first electrode are formed on a substrate of an organic light emitting diode display according to a fifth exemplary embodiment of the present invention.
Figure 6B:
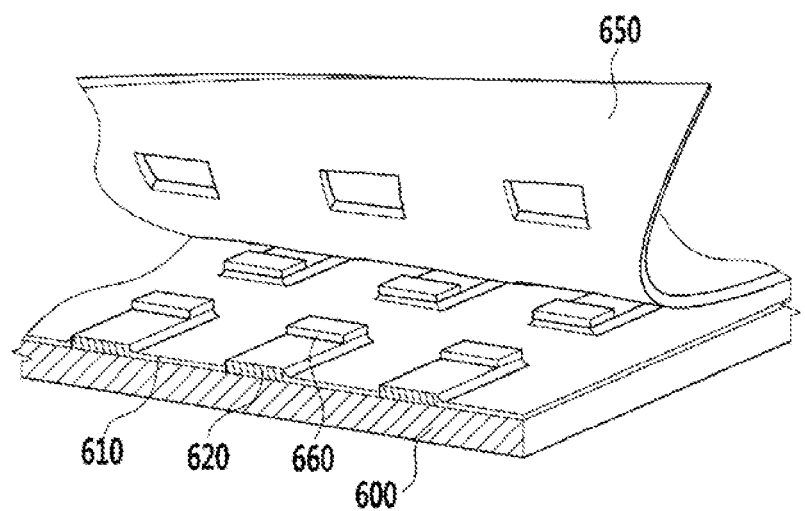
FIG. 6B is a perspective view schematically illustrating a figure where an organic layer is imaged in the organic light emitting diode display according to the fifth exemplary embodiment of the present invention.
Figure 6C:
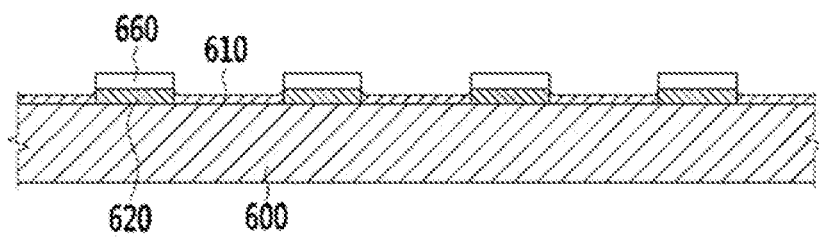
FIG. 6C is a cross-sectional view schematically illustrating the figure where the organic layer is imaged in the organic light emitting diode display according to the fifth exemplary embodiment of the present invention.

FIG. 6A is a perspective view schematically illustrating a state where a pixel defining layer and a first electrode are formed on a substrate of an organic light emitting diode display according to a fifth exemplary embodiment of the present invention, FIG. 6B is a perspective view schematically illustrating a figure where an organic layer is imaged in the organic light emitting diode display according to the fifth exemplary embodiment of the present invention, and FIG. 6C is a cross-sectional view schematically illustrating the figure where the organic layer is imaged in the organic light emitting diode display according to the fifth exemplary embodiment of the present invention.

Referring to FIGS. 6A to 6C, after a first electrode 620 is formed on a substrate 600, a thin insulation layer (not illustrated) may be formed on the first electrode 620 and the substrate 600. The insulation layer may be etched to form a pixel defining layer 610 around the first electrode 620, and is very thin and has a small height so as to act as only insulation/ protection layers in a region between sub-pixel regions. Since an imaging layer 660 is not bent, the imaging layer 660 on the first electrodes 620 is further stably disposed and an attachment property is improved during an imaging process.

Thereafter, a laser-induced thermal imaging method is applied to form an organic layer 660 on the first electrode 620. Since the pixel defining layer 610 is very thin and has a small height in the region between the sub-pixel regions, in an imaging process, a ventilation property is improved and gas is not collected in the sub-pixel region so as to improve imaging quality. However, since the pixel defining layer 610 is not higher than the first electrode 620, expansion of the imaging layer 620 is not prevented during the imaging process.

Thereafter, a second electrode (not illustrated) is formed on the organic layer 660 to seal the organic light emitting diode display, thus accomplishing the organic light emitting diode display.

Figure 7A:
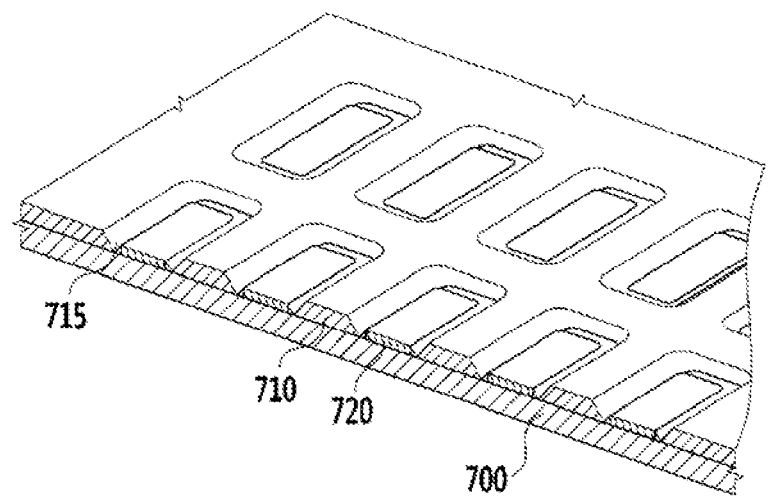
FIG. 7A is a perspective view schematically illustrating a state where a pixel defining layer and a first electrode are formed on a substrate of an organic light emitting diode display according to a sixth exemplary embodiment of the present invention.
Figure 7B:
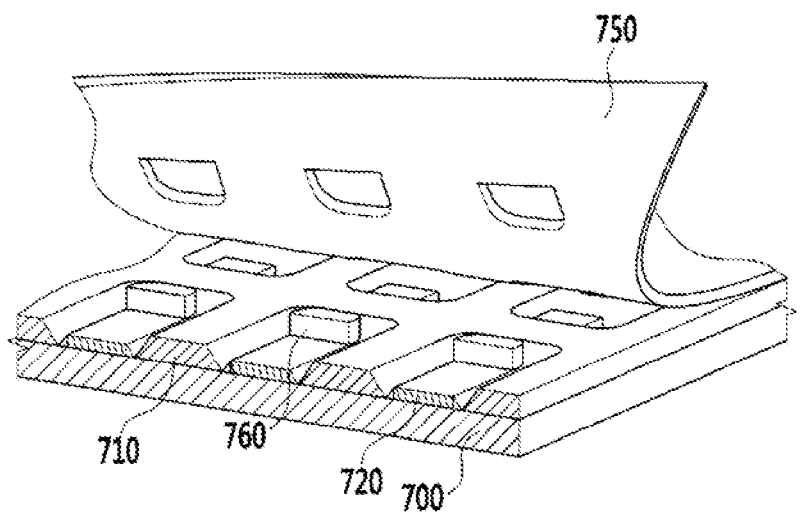
FIG. 7B is a perspective view schematically illustrating a figure where an organic layer is imaged in the organic light emitting diode display according to the sixth exemplary embodiment of the present invention.
Figure 7C:
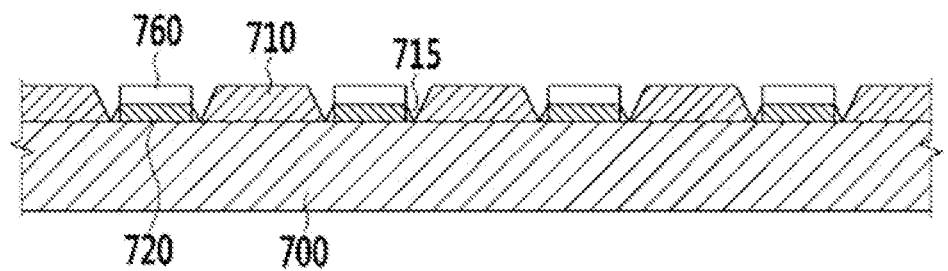
FIG. 7C is a cross-sectional view schematically illustrating the figure where the organic layer is imaged in the organic light emitting diode display according to the sixth exemplary embodiment of the present invention.

FIG. 7A is a perspective view schematically illustrating a state where a pixel defining layer and a first electrode are formed on a substrate of an organic light emitting diode display according to a sixth exemplary embodiment of the present invention, FIG. 7B is a perspective view schematically illustrating a figure where an organic layer is imaged in the organic light emitting diode display according to the sixth exemplary embodiment of the present invention, and FIG. 7C is a cross-sectional view schematically illustrating the figure where the organic layer is imaged in the organic light emitting diode display according to the sixth exemplary embodiment of the present invention.

Referring to FIGS. 7A to 7C, after a first electrode 720 is formed on a substrate 700, an insulation layer (not illustrated) is formed on the first electrode 720 and the substrate 700. The insulation layer is etched to form a pixel defining layer 710. The pixel defining layer 710 has grooves 715 formed in a region between a portion around the first electrode 720 and the sub-pixel region. Furthermore, the pixel defining layer 710 may be higher than the first electrode 720 in the region between the sub-pixel regions. That is, the pixel defining layer 710 may be formed around the first electrode 720 so that the grooves 715 may be formed in a region around the first electrode 720. A residual portion of the pixel defining layer 710 has a large height. Since an imaging layer 760 is not bent, the imaging layer 760 on the first electrode 720 is further stably disposed and an attachment property is improved during an imaging process.

Thereafter, a laser-induced thermal imaging method is applied to form an organic layer 760 on the first electrode 720. The organic layer 760 may be formed so as to have the same height as the pixel defining layer 710 in the region between the sub-pixel regions. Since the grooves 715 exist around the first electrode 720, in an imaging process, a ventilation property is improved and gas is not collected in the sub-pixel region so as to improve imaging quality. However, expansion of the imaging layer 760 is not prevented during the imaging process due to the form of the groove 715.

Thereafter, a second electrode (not illustrated) is formed on the organic layer 760 to seal the organic light emitting diode display, thus accomplishing the organic light emitting diode display.

Figure 8A:
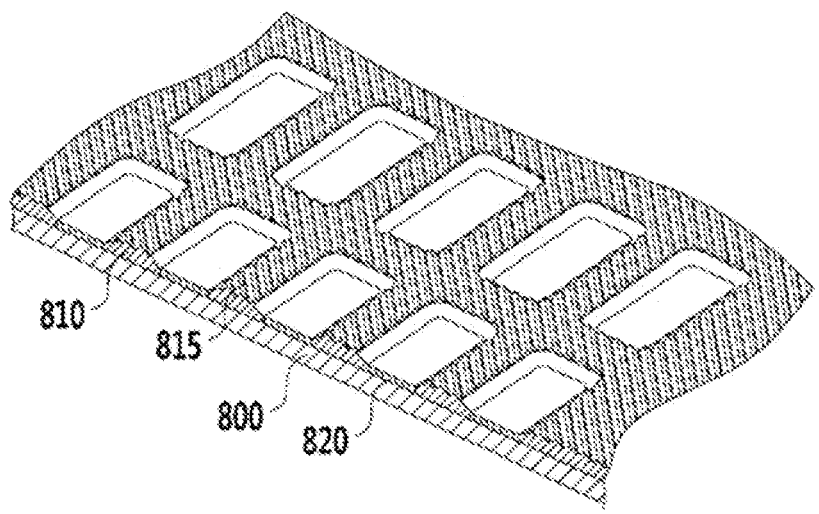
FIG. 8A is a perspective view schematically illustrating a state where a pixel defining layer and a first electrode are formed on a substrate of an organic light emitting diode display according to a seventh exemplary embodiment of the present invention.
Figure 8B:
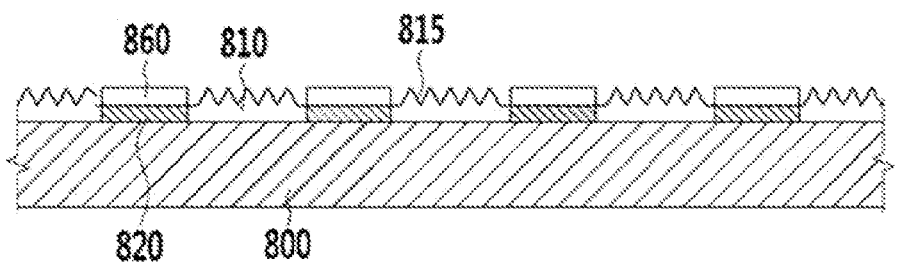
FIG. 8B is a cross-sectional view schematically illustrating a figure where an organic layer is imaged in the organic light emitting diode display according to the seventh exemplary embodiment of the present invention.

FIG. 8A is a perspective view schematically illustrating a state where a pixel defining layer and a first electrode are formed on a substrate of an organic light emitting diode display according to a seventh exemplary embodiment of the present invention, and FIG. 8B is a cross-sectional view schematically illustrating a figure where an organic layer is imaged in the organic light emitting diode display according to the seventh exemplary embodiment of the present invention.

Referring to FIGS. 8A to 8B, after a first electrode 820 is formed on a substrate 800, an insulation layer (not illustrated) may be formed on the first electrode 820 and the substrate 800. Thereafter, the insulation layer is etched to form a pixel defining layer 810. The height of the pixel defining layer 810 around the sub-pixel region may be the same as the height of the first electrode 820. Furthermore, a plurality of grooves 815 that is higher than the first electrode 820 may be formed in a region between the sub-pixel regions in order to prevent attachment of a donor film to the pixel defining layer 810 in the region between the sub-pixel regions. The donor film is connected to only the pixel defining layer 810 in the region between the sub-pixel regions and a very limited region due to the aforementioned structure.

Thereafter, a laser-induced thermal imaging method is applied to form an organic layer 860 on the first electrode 820. Since the pixel defining layer 810 is flat in the sub-pixel region and is formed so as to have the same height as the first electrode 820 of the sub-pixel region, in an imaging process, a ventilation property is improved and gas is not collected in the sub-pixel region so as to improve imaging quality. Furthermore, this form of the pixel defining layer 810 may prevent expansion of the imaging layer 860 during the imaging process. Moreover, the donor film and the pixel defining layer 810 are prevented from being connected and attached in the region between the sub-pixel regions, which does not require imaging.

Thereafter, a second electrode (not illustrated) is formed on the organic layer 860 to seal the organic light emitting diode display, thus accomplishing the organic light emitting diode display.

Figure 9A:
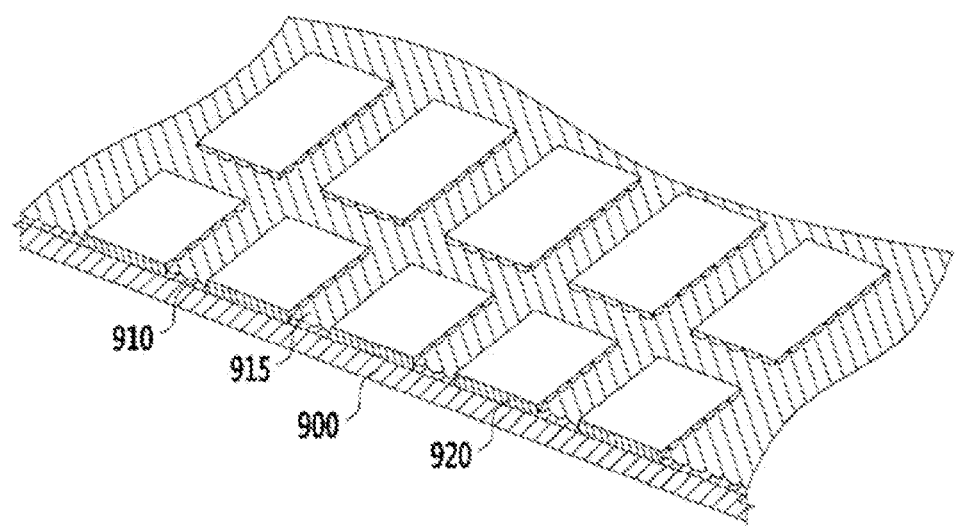
FIG. 9A is a perspective view schematically illustrating a state where a pixel defining layer and a first electrode are formed on a substrate of the organic light emitting diode display according to an eighth exemplary embodiment of the present invention.
Figure 9B:
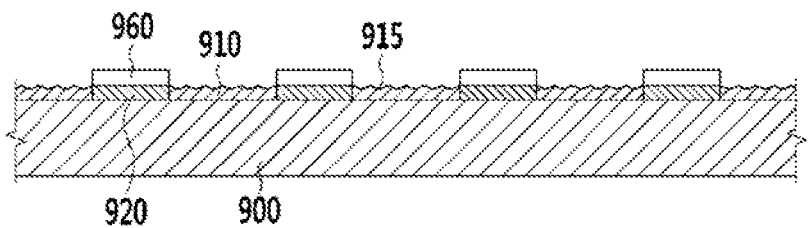
FIG. 9B is a cross-sectional view schematically illustrating a figure where an organic layer is imaged in the organic light emitting diode display according to the eighth exemplary embodiment of the present invention.

FIG. 9A is a perspective view schematically illustrating a state where a pixel defining layer and a first electrode are formed on a substrate of the organic light emitting diode display according to an eighth exemplary embodiment of the present invention, and FIG. 9B is a cross-sectional view schematically illustrating a figure where an organic layer is imaged in the organic light emitting diode display according to the eighth exemplary embodiment of the present invention.

Referring to FIGS. 9A and 9B, after a first electrode 920 is formed on a substrate 900, an insulation layer (not illustrated) may be formed on the first electrode 920 and the substrate 900. The insulation layer is etched to form a pixel defining layer 910. The height of the pixel defining layer 910 is the same as the height of the first electrode 920. The pixel defining layer 910 is formed so as to gradually become low as compared to the heights of the first electrode 920 and the consecutive grooves 915 in order to prevent attachment of the donor film in a region between sub-pixel regions. The donor film is connected to only the pixel defining layer 910 in the region between the sub-pixel regions and a very limited region due to the aforementioned structure.

Thereafter, a laser-induced thermal imaging method is applied to form an organic layer 960 on the first electrode 920. Since most pixel defining layers 910 have the same height as the first electrode 920 and the grooves 915, in an imaging process, a ventilation property is improved and gas is not collected in the sub-pixel region so as to improve imaging quality. However, this form of the pixel defining layer 910 does not prevent expansion of the imaging layer 960 during the imaging process, but prevents the donor film and the pixel defining layer 910 from being connected and attached in the region between the sub-pixel regions, which does not require imaging.

Thereafter, a second electrode (not illustrated) is formed on the organic layer 960 to seal the organic light emitting diode display, thus accomplishing the organic light emitting diode display.

Meanwhile, in the organic light emitting diode display according to the exemplary embodiments of the present invention, the second electrodes formed on the organic layers 260, 360, 460, 560, 660, 760, 860, and 960 may be formed of a transparent or semi-transparent electrode including any one material of calcium (Ca), magnesium (Mg), a magnesium-silver (MgAg) alloy, silver (Ag), a silver alloy, aluminum (Al), and an aluminum alloy.

As described above, according to the exemplary embodiments of the present invention, it is possible to exhaust gas generated in a pixel region during an imaging process by laser-induced thermal imaging during a process of manufacturing an organic light emitting diode display, to prevent pores from being generated, and to stably dispose a donor film on a substrate to improve imaging quality.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light emitting diode display, comprising the steps of:
forming a first electrode on a substrate;
forming an insulation layer on the first electrode;
etching the insulation layer to expose the first electrode and to form a pixel defining layer;
forming an organic layer including at least one emission layer on the first electrode of a sub-pixel region defined by the pixel defining layer by applying a laser-induced thermal imaging (LITI) method; and
forming a second electrode on the organic layer;
wherein the pixel defining layer has an end portion located on a level with the first electrode and disposed against a side end of the first electrode, and a central portion located on a level with the first electrode, disposed adjacent to the end portion, and remote from the side end of the first electrode, said method further comprising providing the end portion with a height which is the same as a height of the first electrode, and providing the central portion with a height which is less than the height of the first electrode in a region adjacent to the sub-pixel region.

2. A method of manufacturing an organic light emitting diode display, comprising the steps of:
forming a first electrode on a substrate;
forming an insulation layer on the first electrode;
etching the insulation layer to expose the first electrode and to form a pixel defining layer;
forming an organic layer including at least one emission layer on the first electrode of a sub-pixel region defined by the pixel defining layer by applying a laser-induced thermal imaging (LITI) method; and
forming a second electrode on the organic layer;
wherein the pixel defining layer has an end portion located on a level with the first electrode and disposed against a side end of the first electrode, and a central portion located on a level with the first electrode, disposed adjacent to the end portion, and remote from the side end of the first electrode, said method further comprising providing the end portion with a height which is the same as a height of the first electrode, and providing the central portion with a height which is greater than the height of the first electrode in a region adjacent to the sub-pixel region.

3. The method of manufacturing an organic light emitting diode display of claim 1, further comprising the step of forming a plurality of grooves in the pixel defining layer for preventing attachment of an imaging layer in the region adjacent to the sub-pixel region.

4. The method of manufacturing an organic light emitting diode display of claim 2, further comprising the step of forming a plurality of grooves in the pixel defining layer for preventing attachment of an imaging layer in the region adjacent to the sub-pixel region.

5. An organic light emitting diode display, comprising:
first electrodes formed on a substrate;
a pixel defining layer having portions formed between adjacent said first electrodes on the substrate, and defining sub-pixel regions;
an organic layer disposed on the first electrodes and including at least one emission layer; and
a second electrode formed on the organic layer;
wherein each said portion of said pixel defining layer has end portions located on a level with, and disposed against sides of, respective adjacent first electrodes, and a central portion located on a level with the adjacent first electrodes and between the end portions, each said end portion being provided with a height which is the same as a height of the adjacent first electrodes, and each said central portion being provided with a height which is less than the height of the adjacent first electrodes.

6. The organic light emitting diode display of claim 5, wherein the second electrode is formed of one of a transparent electrode and a semi-transparent electrode including any one material of calcium (Ca), magnesium (Mg), a magnesium-silver (MgAg) alloy, silver (Ag), a silver alloy, aluminum (Al), and an aluminum alloy.

7. An organic light emitting diode display, comprising:
first electrodes formed on a substrate;
a pixel defining layer having portions formed between adjacent said first electrodes on the substrate, and defining sub-pixel regions;
an organic layer disposed on the first electrodes and including at least one emission layer; and
a second electrode formed on the organic layer;
wherein each said portion of said pixel defining layer has end portions located on a level with, and disposed against sides of, respective adjacent first electrodes, and a central portion located on a level with the adjacent first electrodes and between the end portions, each said end portion being provided with a height which is the same as a height of the adjacent first electrodes, and each said central portion being provided with a height which is greater than the height of the adjacent first electrodes.

8. The organic light emitting diode display of claim 5, further comprising a plurality of grooves formed in the pixel defining layer for preventing attachment of an imaging layer adjacent to the sub-pixel-regions.

9. The organic light emitting diode display of claim 7, further comprising a plurality of grooves formed in the pixel defining layer for preventing attachment of an imaging layer adjacent to the sub-pixel-regions.

10. The organic light emitting diode display of claim 7, wherein the second electrode is formed of one of a transparent electrode and a semi-transparent electrode including any one material of calcium (Ca), magnesium (Mg), a magnesium-silver (MgAg) alloy, silver (Ag), a silver alloy, aluminum (Al), and an aluminum alloy.

* * * * *